(12) United States Patent
Ikeno et al.

(10) Patent No.: US 6,850,103 B2
(45) Date of Patent: Feb. 1, 2005

(54) LOW LEAKAGE SINGLE-STEP LATCH CIRCUIT

(75) Inventors: Rimon Ikeno, Ibaraki (JP); Kaoru Awaka, Ibaraki (JP); Tsuyoshi Tanaka, Ibaraki (JP); Hiroshi Takahashi, Ibaraki (JP); Yutaka Toyonoh, Ibaraki (JP); Akihiro Takegama, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 211 days.

(21) Appl. No.: 10/259,128

(22) Filed: Sep. 27, 2002

(65) Prior Publication Data

US 2004/0061135 A1 Apr. 1, 2004

(51) Int. Cl.$^7$ .......................... H03K 3/289; H03K 3/356
(52) U.S. Cl. ........................ 327/202; 327/203; 327/218
(58) Field of Search ................................ 327/202, 203, 327/200, 208–212, 218

(56) References Cited

U.S. PATENT DOCUMENTS

| | | | | |
|---|---|---|---|---|
| 6,087,886 A | * | 7/2000 | Ko .............................. | 327/408 |
| 6,133,762 A | * | 10/2000 | Hill et al. .................... | 326/119 |
| 6,310,491 B1 | * | 10/2001 | Ogawa ......................... | 326/46 |
| 6,538,471 B1 | * | 3/2003 | Stan et al. .................... | 326/46 |
| 6,603,328 B2 | * | 8/2003 | Takahashi et al. ........... | 324/765 |
| 6,677,797 B2 | * | 1/2004 | Kameyama et al. ........ | 327/333 |

* cited by examiner

Primary Examiner—Tuan T. Lam
(74) Attorney, Agent, or Firm—Robert D. Marshall, Jr..; W. James Brady, III; Frederick J. Telecky, Jr.

(57) ABSTRACT

This invention describes circuit techniques providing a means for achieving reliable data retention and low leakage current in single step latches with switch transistors. The techniques require changes only in the circuit configuration. Neither higher cost technology such as multiple-threshold LVT/HVT transistors nor special control circuits are needed.

8 Claims, 6 Drawing Sheets

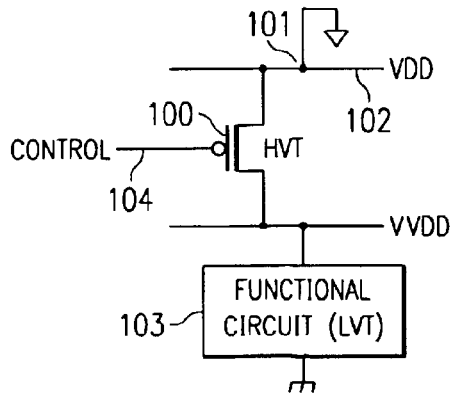
FIG. 1
(PRIOR ART)
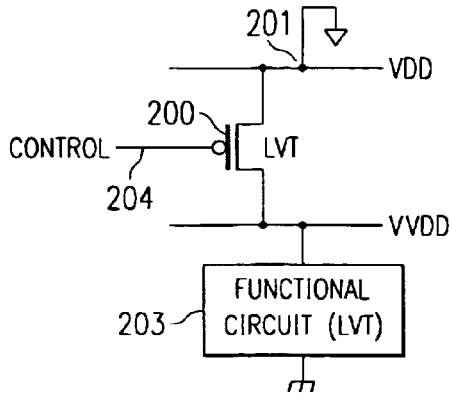
FIG. 2
(PRIOR ART)
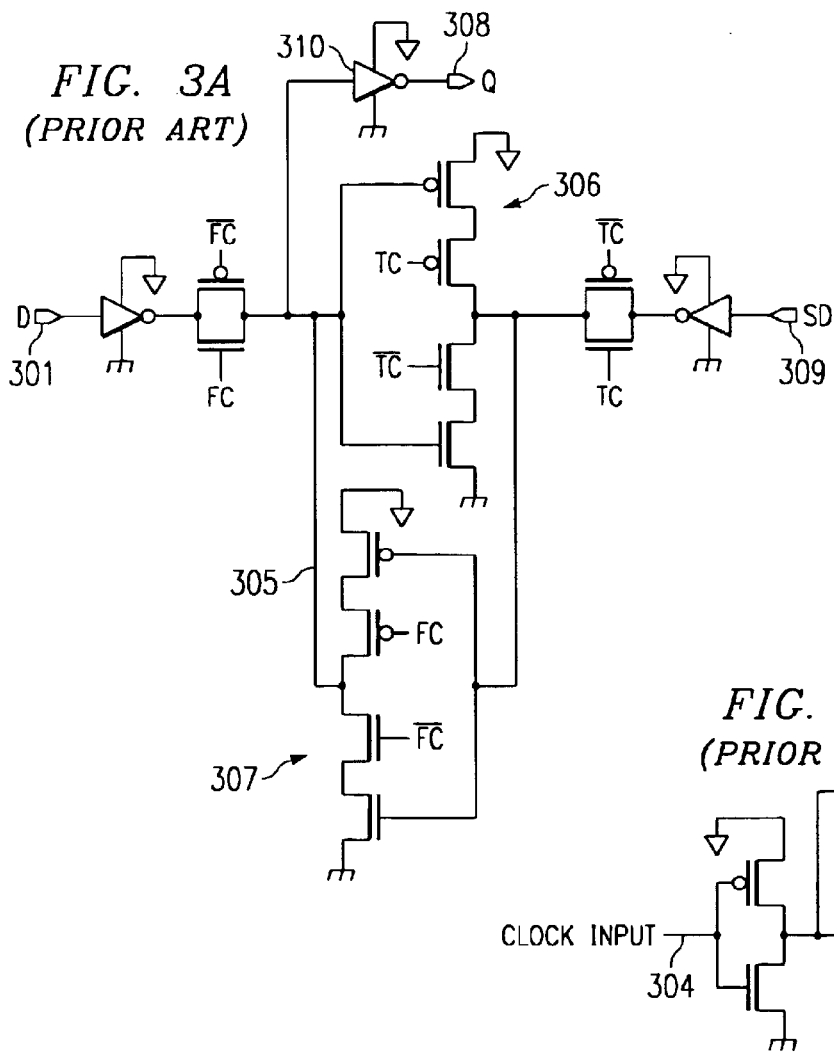
FIG. 3A
(PRIOR ART)
FIG. 3B
(PRIOR ART)

$V_{dd}$ = 1.32V
TEMP = 27C
W = 10.0 μm

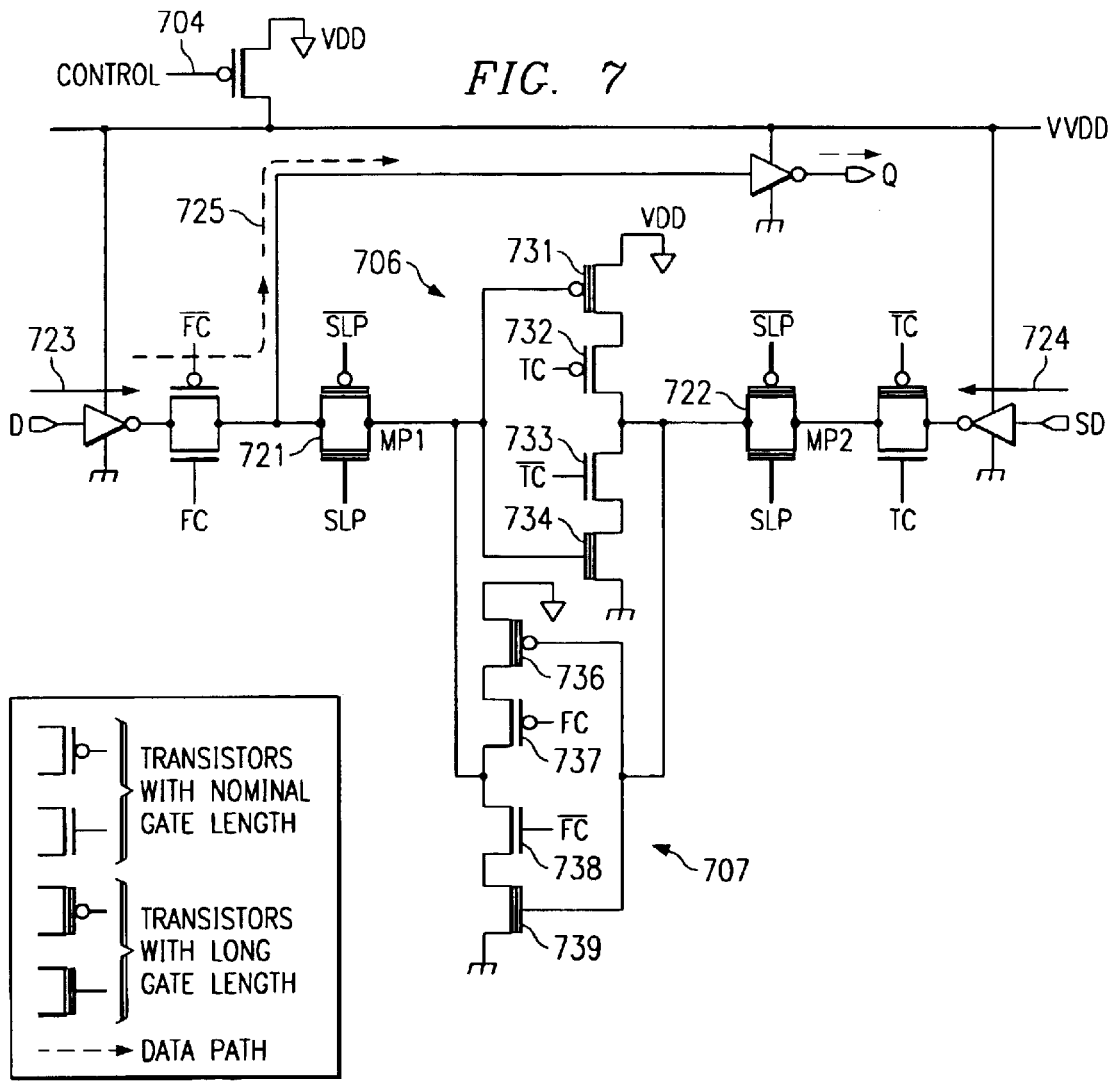
FIG. 7
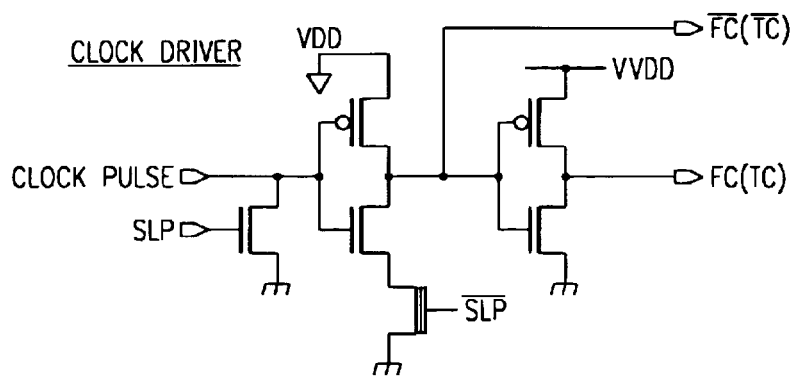

LOW LEAKAGE SINGLE-STEP LATCH CIRCUIT

BACKGROUND OF THE INVENTION

As the minimum feature size of semiconductor devices continues to decrease, the supply voltage for circuits is also decreased. One approach to maintain high circuit performance with such low operating supply voltages is to lower the threshold voltage (VT) of transistors to increase the corresponding drive current. However, as VT becomes lower, the leakage current of the transistor in the 'off' condition increases rapidly. This results in an undesirable increase in power supply drain current for circuits both in the quiescent and in the active states. This 'off' leakage current becomes an important issue especially in large-scale integration (LSI) devices employed in portable equipment whose battery life is affected significantly by the unwanted leakage current.

To reduce the leakage current during the quiescent state, several circuit configurations have been proposed using switch transistors to break open leakage paths. One of the conventional switching approaches is illustrated in FIG. 1. This approach is often referred to as multi-threshold (MT) CMOS approach. In this circuit, a PMOS switch transistor 100 is inserted between the power supply (VDD) 101 and the virtual power supply (VVDD) 102. The switch transistor 100 has higher threshold voltage, VT=HVT, than transistors in the functional circuit 103, which have a low threshold voltage, VT=(LVT). The switch 100 is turned 'on' while the circuit is 'active', and it is turned 'off' when the circuit is in the quiescent or 'sleep' mode, this control being provided by control signal 104. The leakage current during the 'sleep' mode is significantly reduced compared with the ordinary LVT circuits not using the HVT switch transistor 100.

Another conventional approach to quiescent current reduction is often referred to as 'super cut-off' (SC) CMOS. This approach uses a single threshold voltage LVT technology and is illustrated in FIG. 2. Since the switch transistor 200 is fabricated by the same LVT technology as transistors of the functional circuit 203, the 'super cut-off' approach allows for lower fabrication cost than multi-threshold MT CMOS. The gate of the switch transistor 200 is pulled up by control signal 204 beyond the supply voltage by an amount sufficient to strongly cut the leakage current of the LVT switch transistor 200 in the 'sleep' mode.

However, in such conventional switching approaches, data retention of memory circuits, such as latches and flip-flops, is a serious concern. The circuit diagram of the conventional single-step (SS) latch is illustrated in FIG. 3A. The clock driver circuit illustrated in FIG. 3B. Data is input at 301. Functional clock FC 302 is derived from the clock driver of FIG. 3B, which is driven by narrow-width clock pulses 304 from a special pulse generation circuit. When FC 302 goes to the 'high' state, data is stored in the latch 305 comprised of cross-coupled clocked inverters 306 and 307. The latched data appears at Q 308 after FC goes 'high', delayed only by the gate delay of inverter 310. Scan data SD 309 and test clock TC 310 operate in similar manner with D 301 and FC 302 as inputs, respectively. The SD inputs and TC inputs are used only in the scan test mode.

The circuit diagram of a single step latch with switch transistor for sleep mode control is illustrated in FIG. 4. Switch transistor 400 performs the connection or disconnect of virtual power supply 401 and physical power supply 409 under the control of input 404. In this circuit, the data latched in latch 405 is not retained over the sleep mode because the circuit is separated from the power supply by switch transistor 400 during the sleep mode and the stored charge, on nodes 411 and 412, for example, will be lost.

FIG. 5 illustrates another approach of applying he switch-transistor scheme to a single step latch. In this circuit the key latch circuit elements 506 and 507 for data retention are clocked inverters and are connected to the power supply directly so that they are kept active during the 'sleep' mode. However, in this circuit configuration the 'off' leakage current is of concern again because of the leakage paths denoted by arrows labeled 509, 510, 511, and 512. One approach to reduce leakage is to use HVT transistors in these leakage paths. This would require larger geometry transistors because WIT transistors have less drive current than LVT transistors. Furthermore, such multi-threshold technology combining both LVT and HVT transistors requires higher fabrication cost than a single threshold technology.

SUMMARY OF THE INVENTION

This invention describes circuit techniques providing a means for achieving reliable data retention and low leakage current in single step latches with switch transistors. The techniques require changes only in the circuit configuration. Neither higher cost technology such as multiple-threshold LVT/HVT transistors nor special control circuits are needed.

The circuit of this invention differs from earlier proposed single step latch circuits as follows:

1. Leakage paths are completely removed with least impact on the circuit performance;

2. Complicated sleep control is not needed for the circuit operation;

3. Only LVT transistors are needed when long-gate devices can reduce leakage current;

4. Significant reduction of leakage current can be achieved without HVT transistors;

5. Special control circuit is not needed for sleep control; and

6. Circuit performance degradation is minimized.

BRIEF DESCRIPTION OF THE DRAWINGS

These and other aspects of this invention are illustrated in the drawings, in which:

FIG. 1 illustrates a conventional multi-threshold (MT) CMOS circuit (Prior Art);

FIG. 2 illustrates a conventional super cut-off SC CMOS circuit (Prior Art);

FIG. 3A illustrates a conventional single-step latch circuit (Prior Art);

FIG. 3B illustrates a conventional clock driver circuit (Prior Art);

FIG. 7 illustrates a low leakage single-step latch circuit of this invention with switch transistor for sleep mode and with data retention function;

DETAILED DESCRIPTION OF PREFERRED EMBODIMENTS

This invention describes circuit techniques providing a means for achieving reliable data retention and low leakage current in single step latches with switch transistors. The techniques require changes only in the circuit configuration. Neither higher cost technology such as multiple-threshold LVT/HVT transistors nor special control circuits are needed.

Figure 4:
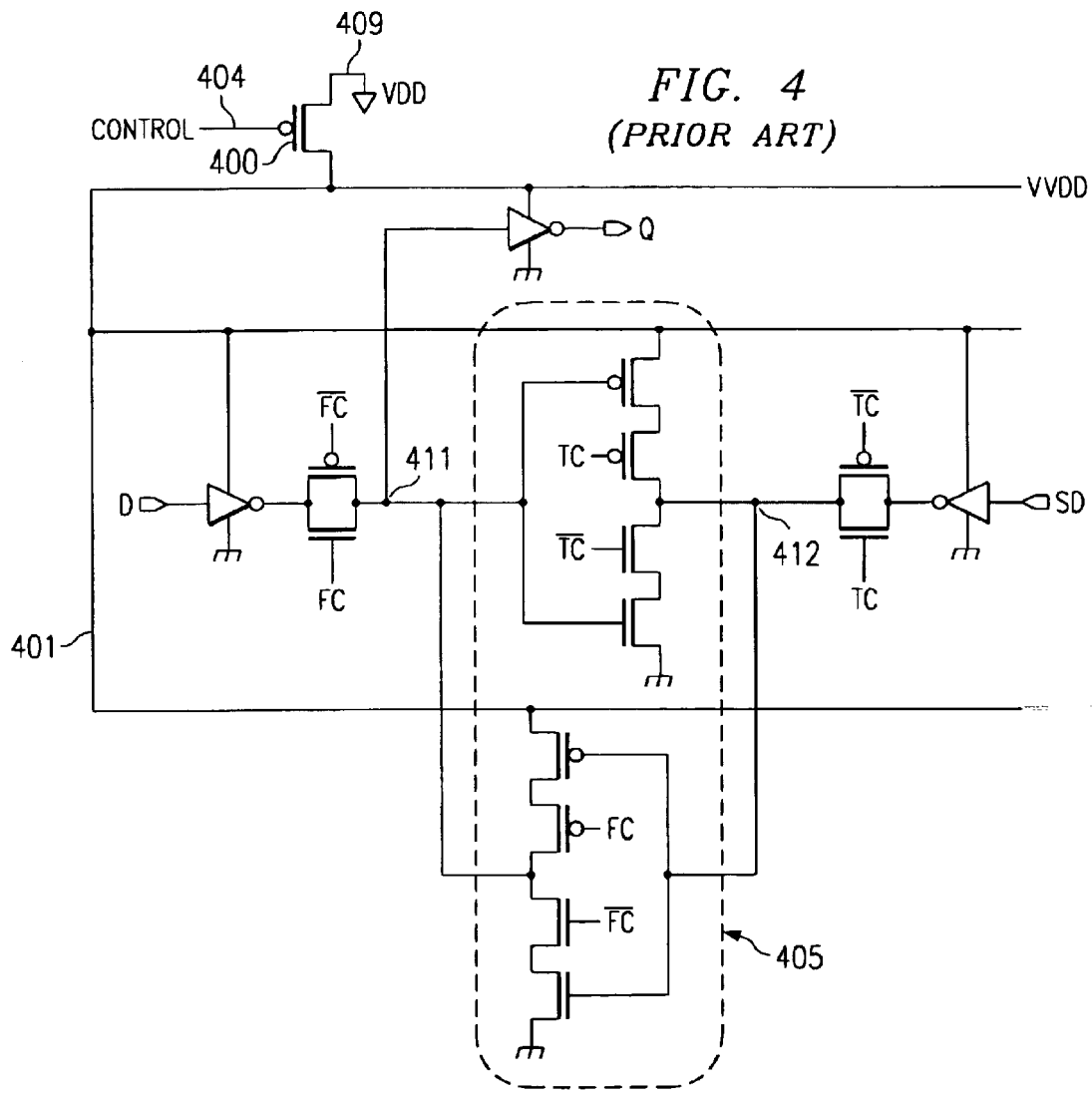
FIG. 4 illustrates a conventional single-step latch circuit with switch transistor for sleep mode (Prior Art)
Figure 6:
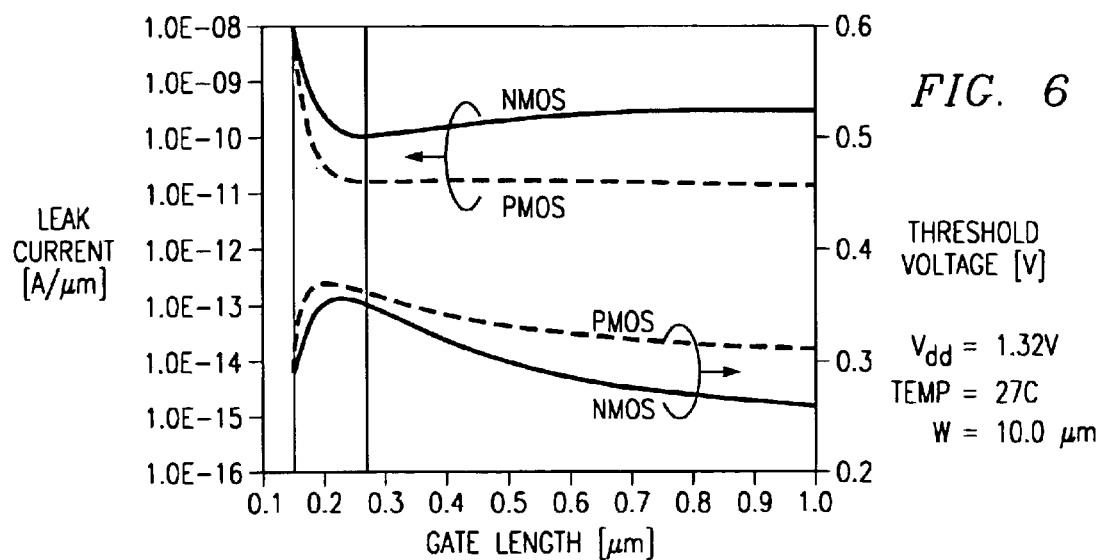
FIG. 6 illustrates the 'off' current and threshold voltage versus gate length of transistors employed in this invention.

FIG. 6 illustrates the leakage current and threshold voltage characteristics versus gate length for a representative high performance CMOS technology. Leakage current on the left vertical axis is on a logarithmic scale and threshold voltage values on right vertical scale are linear. The transistors represented are low threshold voltage technology with potentially high leakage. The minimum gate length that is used for the nominal transistors is 0.15 $\mu$m.

Leakage current rapidly decreases as the gate length becomes longer than the minimum size. The minimum leakage current is observed around 0.275 $\mu$m and is about one-fiftieth of that of the nominal NMOS transistor. Long gate transistors may be used in portions of the circuit which are not performance critical, but are low-leakage critical. This is an approach preferable to using multi-threshold LVT/HVT technology in that it avoids increased fabrication cost.

Long gate transistors have lower speed performance than nominal gate length devices. As a result, special care must be exercised in designing circuits with long gate devices so as to minimize any effects on speed performance.

The means for obtaining the low leakage in the single step latch (SS) of this invention is illustrated in FIG. 7. This SS latch maintains data retention during the sleep mode. Additional transfer gates 721 and 722 with long gates are inserted between the data path 723 and 724 and the data retention portion of the circuit comprised of clocked inverters 706 and 707. Long gate transistors 731, 734, 736, and 739 are also used in the clock inverters 706 and 707 to reduce the leakage current during the sleep mode. Transistors 732, 733, 737 and 738 are nominal gate length transistors. Though performance of the clocked inverters is degraded due to the lessened current drive ability of the long-gate transistors, this does not affect the performance of the latch circuit because these inverters are not in the data path denoted by path 725. In order to keep FC and TC and the complement signals $\overline{FC}$ and $\overline{TC}$ at adequate levels during the sleep mode two more transistors are added to the clock driver.

If HVT transistors are available, the long-gate transistors in this invention can be used in leakage critical paths. However, since integration of both LVT and HVT transistors results in higher fabrication cost than a single VT technology, the above long-gate approach might be preferable to such multi-threshold approaches.

Figure 8:
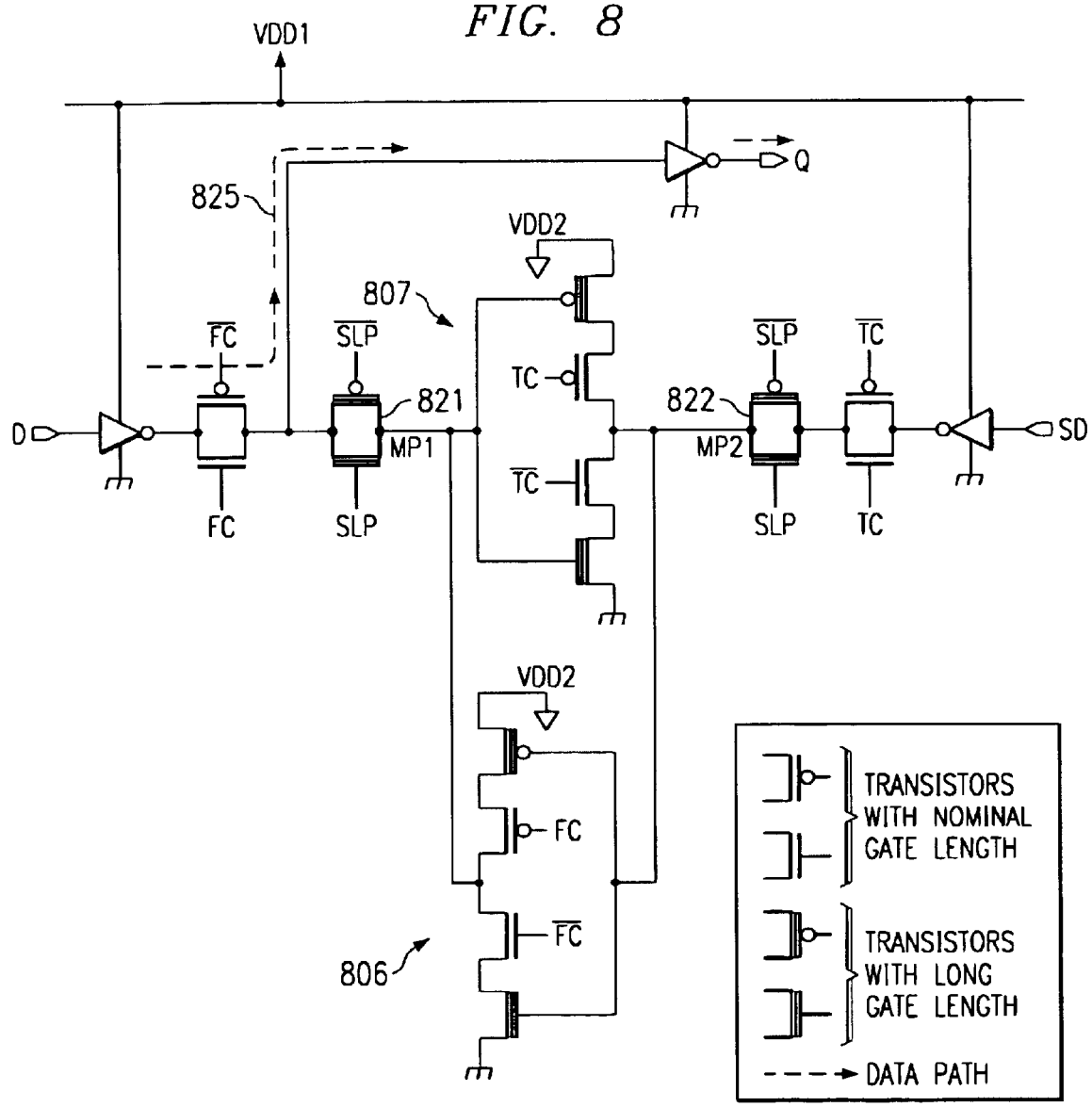
FIG. 8 illustrates a low leakage conventional single-step latch circuit with switch transistor for sleep mode and with data retention function with multiple power sources.

Another embodiment of the present invention is illustrated in FIG. 8. In this circuit two power sources, VDD2 and VDD1 are used for the clocked inverters as well as for the other circuits instead of using switch transistors for the sleep control. In the sleep mode, the power supply for the ordinary circuits is shut down by an external switch or by using voltage controller like the 'low drop-out' (LDO) voltage regulator. In the circuit configuration of FIG. 8, the circuit performance does not suffer from the voltage drop by the switch transistor.

The leakage current path through the switch transistor itself is also removed. It is also possible to control the supply voltage of the data retention circuit in the sleep mode. For example, VDD can be 0.7 volts during the sleep mode, which is lower than the 1.2 volts used in the active mode to reduce the leakage current. Furthermore, if the sleep signal SLP is kept higher than the sleep mode VDD2, 1.0 V for example, PMOS transistors for the transfer gates, 821 and 822, can be nominal devices instead of long-gate devices. This is because their gate voltage is at least 0.3 volts higher than their source and drain voltages, and their leakage currents are significantly reduced by the negative gate-bias effect. This circuit diagram and its operation are illustrated in FIG. 9.

Figure 5:
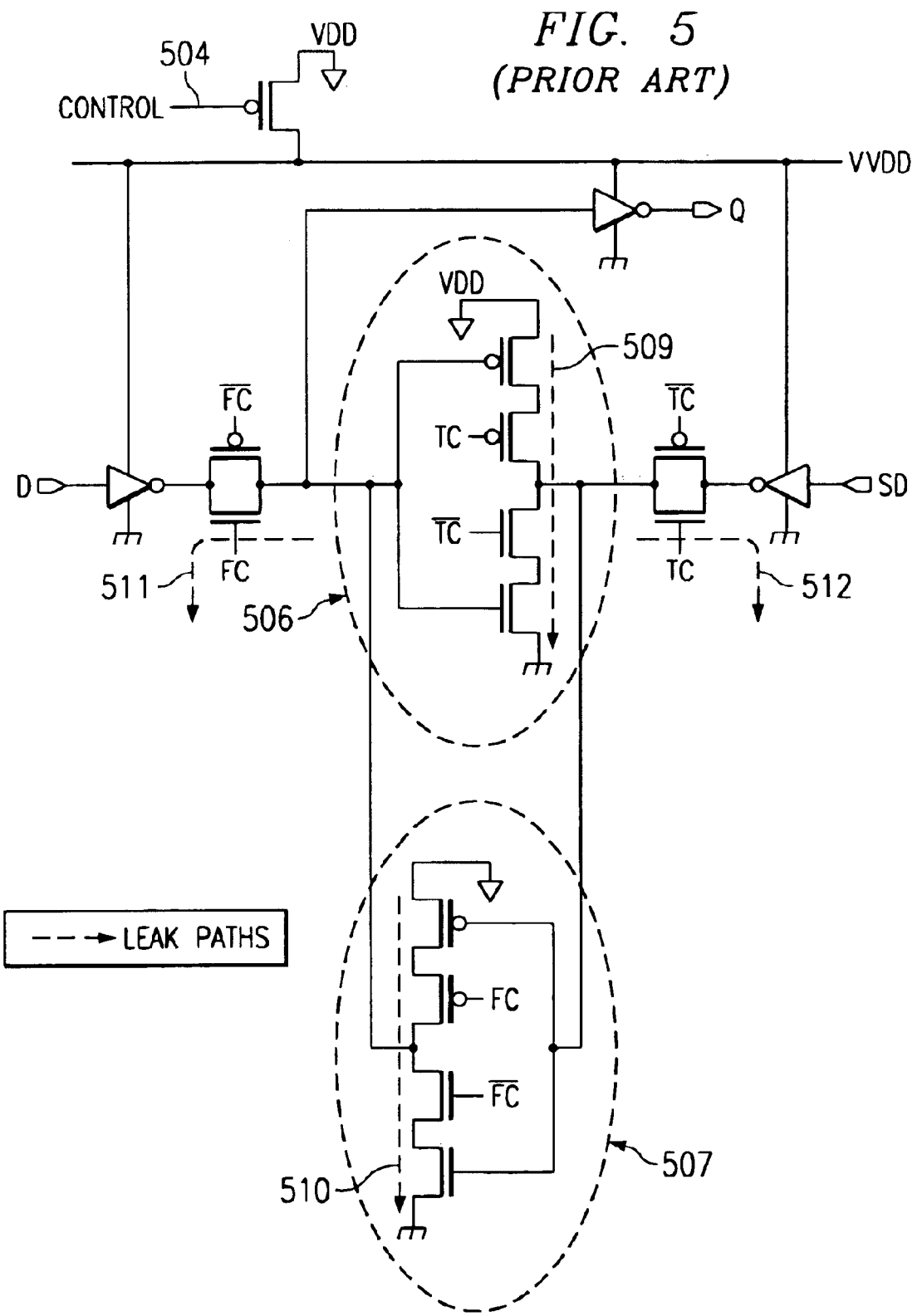
FIG. 5 illustrates a conventional single-step latch circuit with switch transistor for sleep mode and with data retention (Prior Art)
Figure 9:
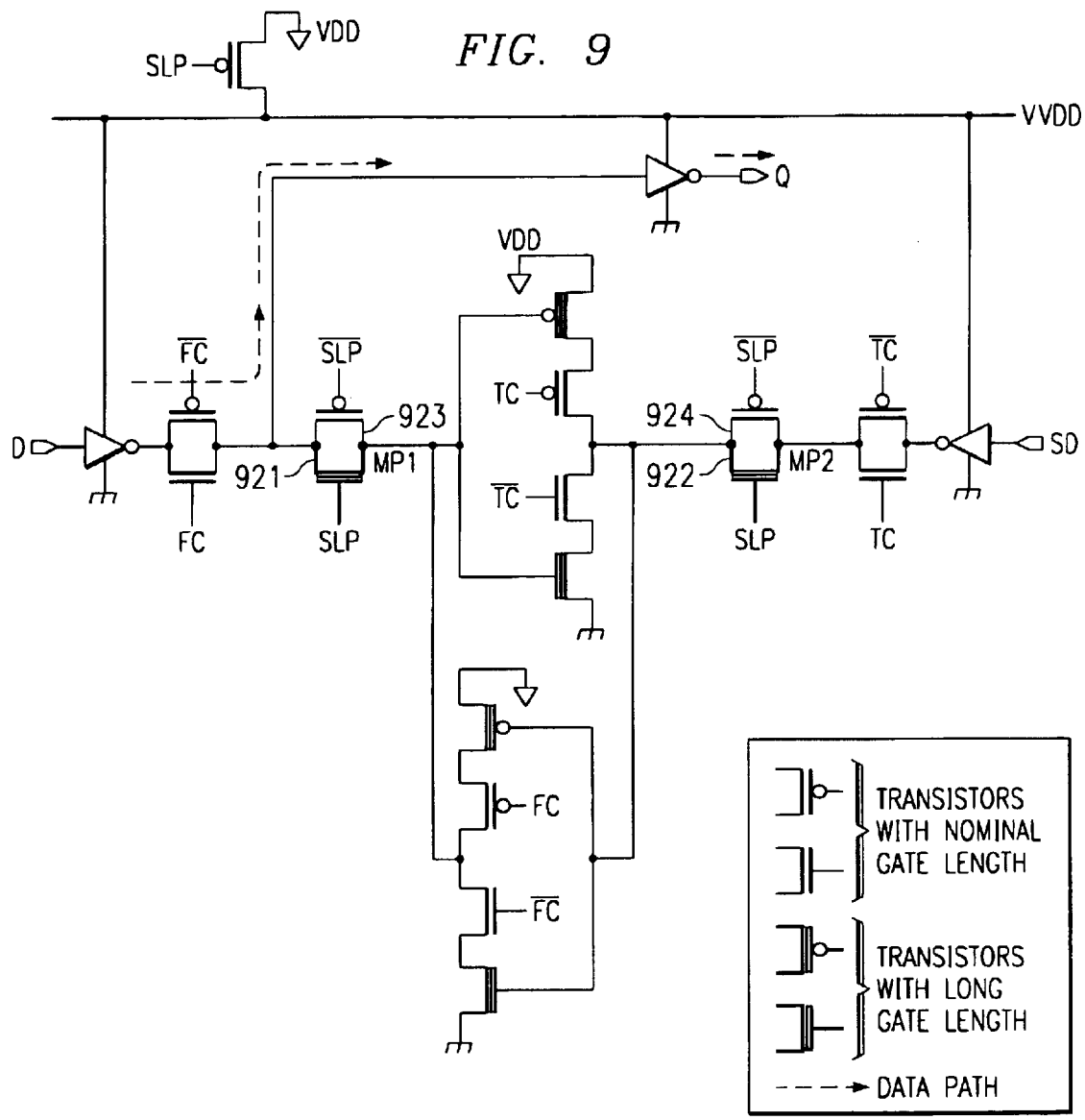
FIG. 9 illustrates a low leakage conventional single-step latch circuit with switch transistor for sleep mode and with data retention function, but with single power source.

Comparisons of the performances of the single-step latch of FIG. 9 versus the original circuit of FIG. 5 have been made using SPICE analysis. The voltage-control scheme described in the previous paragraph is applied. Long gate length devices are used for NMOS transfer gate elements 921 and 922. Nominal gate length devices are used for PMOS transfer gates elements 923 and 924. Delay is measured from the clock input FC to the data output Q for both high and low data at the data input D. Power is measured toggling the data. Quiescent power drain, Iddq, is measured assuming the sleep mode in which the switch transistor is turned off.

TABLE 1

| | Delay data H (ns) | Delay data L (ns) | Active Power (mw) | Iddq Active |
|---|---|---|---|---|
| Original SS Latch FIG. 5 | 0.1829 100.0% | 0.1728 100.0% | 0.0273 100.0% | 1.3E−08 100.0% |
| Present Invention FIG. 9 | 0.1928 105.4% | 0.11891 109.4% | 0.0314 114.9% | 2.5E−10 1.95% |

As shown in Table 1, quiescent power drain current Iddq of the new circuit is reduced to about 1/50 of that of the original circuit by the new circuit configuration of FIG. 9. Propagation delay values and active state power drain values are both slightly higher because the additional transfer gates 921 and 922 increase capacitance on the critical path.

The circuit of this invention differs from earlier proposed circuits on the following points:

1. Leakage paths are completely removed with leas impact on the circuit performance;

2. Complicated sleep control is not needed for the circuit operation;

3. Only LVT transistors are needed when long-gate devices can reduce leakage current;

4. Significant reduction of leakage current can be achieved without HVT transistors;

5. Special control circuit is not needed for sleep control; and

6. Circuit performance degradation is minimized.

What is claimed is:

1. A CMOS data latch circuit having low leakage current drain comprising:

a data input;

a first clocked transfer gate including transistors with nominal gate length having an input connected to said data input of the data latch circuit and an output connected to an output of the data latch circuit, said first clocked transfer gate clocked by a functional clock signal and an inverse functional clock signal;

a second clocked transfer gate including transistors with long gates longer than said nominal gate length having an input connected to said output of said first clocked transfer gate and an output, said second clocked transfer gate clocked by a sleep signal and an inverse sleep signal;

a first CMOS latch inverter having an input connected to said output of said second clocked transfer gate and an output, said first CMOS latch inverter including a serial connection of a PMOS long gate transistor and a NMOS long gate transistor connected between a power supply and ground; and a second CMOS latch inverter having an input connected to said output of said first CMOS latch inverter and an output connected to said input of said first CMOS latch inverter, said second CMOS latch inverter including a serial connection between said power supply and ground of a PMOS long gate transistor having a source-drain path connected between said power supply and a first intermediate node and a gate connected to said output of said first CMOS latch inverter, a PMOS nominal gate transistor having a source-drain path connected between said first intermediate node and said output and a gate receiving said functional clock signal, a NMOS nominal gate transistor having a source-drain path connected between said output and a second intermediate node and a gate receiving said inverse functional clock signal, and a NMOS long gate transistor having a source-drain path connected between said second intermediate node and ground and a gate connected to said output of said first CMOS latch inverter.

2. The CMOS data latch circuit of claim 1 further comprising:

an input inverter including transistors with nominal gate length having an input connected to said data input of the data latch circuit and an output connected to the input of said first clocked transfer gate; and an output inverter including transistors with nominal gate length having an input connected to said output of said first clocked transfer gate and an output connected to the output of the data latch circuit.

3. The CMOS data latch circuit of claim 2 further comprising:

a PMOS transistor having a source connected to said power supply, a gate receiving said sleep signal and a drain supplying a virtual power supply;

said virtual power supply being OFF in a sleep mode and powering said input inverter and said output inverter; and said power supply being ON in said sleep mode and powering said first CMOS latch inverter and said second CMOS latch inverter.

4. The CMOS data latch circuit of claim 1 wherein:

said functional clock cycles between first and second digital states when in non-sleep mode and remains at said first digital state when in sleep mode.

5. The CMOS data latch circuit of claim 1 further comprising:

a scan input;

a third clocked transfer gate including transistors with said nominal gate length having an input connected to said scan input of the data latch circuit and an output, said third clocked transfer gate clocked by a scan clock signal and an inverse scan clock signal;

a fourth clocked transfer gate including transistors with long gates longer than said nominal gate length having an input connected to said output of said third clocked transfer gate and an output connected to said input of said second CMOS latch inverter, said fourth clocked transfer gate clocked by said sleep signal and said inverse sleep signal; and wherein said first CMOS inverter includes a serial connection between said power supply and ground of said PMOS long gate transistor having a source-drain path connected between said power supply and a third intermediate node and a gate connected to said output of said second CMOS latch inverter, a PMOS nominal gate transistor having a source-drain path connected between said third intermediate node and said output and a gate receiving said scan clock signal, a NMOS nominal gate transistor having a source-drain path connected between said output and a fourth intermediate node and a gate receiving said inverse scan clock signal, and said NMOS long gate transistor having a source-drain path connected between said fourth intermediate node and ground and a gate connected to said output of said second CMOS latch inverter.

6. The CMOS data latch circuit of claim 5 further comprising:

a PMOS transistor having a source connected to said power supply, a gate receiving said sleep signal and a drain supplying a virtual power supply;

an input inverter including transistors with nominal gate length having an input connected to said data input of the data latch circuit and an output connected to the input of said first clocked transfer gate, said in output inverter powered by said virtual power supply;

an output inverter including transistors with nominal gate length having an input connected to said output of aid first clocked transfer gate and an output connected to the output of the data latch circuit, said output inverter powered by said virtual power supply; and a scan input inverter including transistors with nominal gate length having an input connected to said scan input of the data latch circuit and an output connected to the input of said third clocked transfer gate, said scan input inverter powered by said virtual power supply said virtual power supply being OFF in a sleep mode and powering said input inverter, said output inverter and said scan input inverter; and said power supply being ON in said sleep mode and powering said first CMOS latch inverter and said second CMOS latch inverter.

7. A CMOS data latch circuit having low leakage current drain comprising:

a first power supply OFF in a sleep mode;

a second power supply having a first voltage in non-sleep mode and a second voltage lower than said first voltage in said sleep mode;

a data input;

a first clocked transfer gate including transistors with nominal gate length having an input connected to said data input of the data latch circuit and an output connected to an output of the data latch circuit, said first clocked transfer gate cocked by a functional clock signal and an inverse functional clock signal;

a second clocked transfer gate including transistors with long gates longer than said nominal gate length having an input connected to said output of said first clocked transfer gate and an output, said second clocked transfer gate clocked by a sleep signal and an inverse sleep signal;

a first CMOS latch inverter having an input connected to said output of said second clocked transfer gate and an output, said first CMOS latch inverter powered by said second power supply and including a serial connection of a PMOS long gate transistor and a NMOS long gate transistor connected between said second power supply and ground; and a second CMOS latch inverter having an input connected to said output of said first CMOS latch inverter and an output connected to said input of said first CMOS latch inverter, said second CMOS latch inverter powered by said second power supply and including a serial connection between said power supply and ground of
- a PMOS long gate transistor having a source-drain path connected between second power supply and a first intermediate node and a gate connected to said output of said first CMOS latch inverter,
- a PMOS nominal gate transistor having a source-drain path connected between said first intermediate node and said output and a gate receiving said functional clock signal,
- a NMOS nominal gate transistor having a source-drain path connected between said output and a second intermediate node and a gate receiving said inverse functional clock signal, and
- a NMOS long gate transistor having a source-drain path connected between said second intermediate node and ground and a gate connected to said output of said first CMOS latch inverter;

an input inverter including transistors with nominal gate length having an input connected to said data input of the data latch circuit and an output connected to the input of said first clocked transfer gate, said input inverted powered by said first power supply; and an output inverter including transistors with nominal gate length having an input connected to said output of said first clocked transfer gate and an output connected to the output of the data latch circuit, said output inverter powered by said first power supply.

8. A CMOS data latch circuit having low leakage current drain comprising:

a first power supply OFF in a sleep mode;

a second power supply having a first voltage in an on-sleep mode and a second voltage lower than said first voltage in said sleep mode;

a data input;

a first clocked transfer gate including transistors with nominal gate length having an input connected to said data input of the data latch circuit and an output connected to an output of the data latch circuit, said first clocked transfer gate clocked by a functional clock signal and an inverse functional clock signal;

a second clocked transfer gate including transistors with long gates longer than said nominal gate length having an input connected to said output of said first clocked transfer gate and an output, said second clocked transfer gate clocked by a sleep signal and an inverse sleep signal;

a first CMOS latch inverter having an input connected to said output of said second clocked transfer gate and an output, said first CMOS latch inverter powered by said second power supply and including a serial connection of
- a PMOS long gate transistor having a source-drain path connected between said second power supply and a third intermediate node and a gate connected to said output of said second CMOS latch inverter,
- a PMOS nominal gate transistor having a source-drain path connected between said third intermediate node and said output and a gate receiving a scan clock signal,
- a NMOS nominal ate transistor having a source-drain path connected between said output and a fourth intermediate node and a gate receiving said inverse scan clock signal, and
- a NMOS long gate transistor having a source-drain path connected between said fourth intermediate node and ground and a gate connected to said output of said second CMOS latch inverter;

a second CMOS latch inverter having an input connected to said output of said first CMOS latch inverter and an output connected to said input of said first CMOS latch inverter, said second CMOS latch inverter powered by said second power supply and including a serial connection between said second supply and ground of
- a PMOS long gate transistor having a source-drain path connected between said second power supply and a first intermediate node a ate connected to said output of said first CMOS latch inverter,
- a PMOS nominal gate transistor having a source-drain path connected between said first intermediate node and said output and a gate receiving said functional clock signal,
- a NMOS nominal ate transistor having a source-drain path connected between said output and a second intermediate node and a gate receiving said inverse functional clock signal, and
- a NMOS long gate transistor having a source-drain path connected between said second intermediate node and ground and a gate connected to said output of said first CMOS latch inverter;

an input inverter including transistors with nominal gate length having an input connected to said data input of the data latch circuit and an output connected to the input of said first clocked transfer gate, said input inverter powered by said first power supply;

an output inverter including transistors with nominal gate length having an input connected to said output of said first clocked transfer gate and an output connected to the output of the data latch circuit, said output inverter powered by said first power supply; and a scan input inverter including transistors with nominal gate length having an input connected to said scan input of the data latch circuit and an output connected to the input of said third clocked transfer gate, said scan input inverter powered by said first power supply.

* * * * *